United States Patent [19]

Suzuki

[11] Patent Number: 4,841,338
[45] Date of Patent: Jun. 20, 1989

[54] IMAGE RECORDING AND ADHERING APPARATUS

[75] Inventor: Keiko Suzuki, Okazaki, Japan

[73] Assignee: Brother Kogyo Kabushiki Kaisha, Aichi, Japan

[21] Appl. No.: 173,609

[22] Filed: Mar. 25, 1988

[30] Foreign Application Priority Data

Mar. 27, 1987 [JP] Japan .................................. 62-75664
Sep. 22, 1987 [JP] Japan ................................. 62-238453

[51] Int. Cl.[4] ...................... G03B 27/32; G03B 27/52; G03C 1/72
[52] U.S. Cl. ...................................... 355/27; 355/100; 430/138
[58] Field of Search ................... 355/27, 100; 430/138; 354/84, 85, 86; 156/106, 184, 379.8

[56] References Cited

U.S. PATENT DOCUMENTS

| | | | |
|---|---|---|---|
| 4,365,018 | 12/1982 | Crutchfield et al. | 430/138 X |
| 4,399,209 | 8/1983 | Sanders et al. | 430/138 |
| 4,440,846 | 4/1984 | Sanders et al. | 430/138 |
| 4,554,235 | 11/1985 | Adair et al. | 430/138 |
| 4,727,392 | 2/1988 | Stone et al. | 355/27 X |
| 4,740,809 | 4/1988 | Yamamoto et al. | 355/100 X |
| 4,742,374 | 5/1988 | Yamamoto et al. | 430/138 X |
| 4,748,475 | 5/1988 | Ishiyama et al. | 355/27 |
| 4,777,513 | 10/1988 | Nelson | 355/27 |
| 4,785,332 | 11/1988 | Nagumo et al. | 355/27 |

*Primary Examiner*—Richard A. Wintercorn
*Attorney, Agent, or Firm*—Oliff & Berridge

[57] ABSTRACT

The photocopying is usually made by the chemical reaction with the developing agents on photosensitive sheet or on separate developing agents layer. However, any type of sheet of paper such as mail card, card stock or the like can be photocopied in such manner that the photocopied image formed on photosensitive sheet is adhered to the sheet of paper by using an adhesive coater. Using this method, the sheets of paper are double folded after adhering.

Further, instead of adhering the photosensitive sheet to the sheet of paper, the image can also be formed on the sheet of paper by coating developing agents thereon for chemical reaction with the photosensitive sheet. Thus the thickness of paper can be reduced to a single sheet of paper.

12 Claims, 4 Drawing Sheets

IMAGE RECORDING AND ADHERING APPARATUS

BACKGROUND OF INVENTION

1. Field of Invention

This invention relates to an image recording and adhering apparatus for forming an image the same as the printed image on sheets of card stock (mail card) or sheets of paper in general.

2. Description of the Prior Art

When photocopying an original, it is generally known that an intermediate image is formed first in the form of tonal image and then copied onto the sheet of paper in general such as card stock (mail card) and the like by using a copying apparatus. However, this photocopying method is not sufficient enough to provide a good printing quality due to the intermediate process using and intermediate image formed by tonal materials.

In connection with the use of this type of an intermediate image, there is a well-known photosensitive sheet such as for example disclosed in Japanese Unexamined Patent Application No. 58-23025 (U.S. Pat. No. 4440,846) or Japanese Unexamined Patent Application No. 58-88739 (U.S. Pat. No. 4399,209). There are two types of this kind of photosensitive sheet, namely what is termed the self-contained type and the transfer type. The photosensitive sheet of self-contained type consists of three layers, a sheet-form support, developing agents layer and microcapsule layer encapsulating chromogenic materials, photocuring resins, a sensitizer and a polymerization initiator.

When a photofilm-type original is located over the photosensitive sheet, light only permeates through the non-imaged portion of the photofilm into the microcapsules corresponding to the non-imaged portion of the original. When exposed to light, these microcapsules are cured while the other microcapsules, not exposed to light, are not cured. This photosensitive sheet is then pressed between press rollers. The uncured microcapsules are ruptured while the cured microcapsules are left unbroken on the photosensitive sheet.

Here, the cured microcapsules are exposed to light through the non-imaged portion of the original. As a result, chromogenic materials are effused from the ruptured microcapsules and chemically developed with the developing agents of the developing agents layer, thus coloring the photocopied image.

On the other hand, when the transfer-type photosensitive sheet is used, there is only a microcapsule layer formed on the photosensitive sheet but not the developing agents thereunder. Due to this, chromogenic materials effused from the microcapsules are chemically reacted with the developing agents which are separately prepared on another developing agents layer.

Usually, the surface of the photosensitive sheet exposed to light is overlapped with this separate developing agents layer and then pressed altogether by press rollers. When pressed, the chromogenic materials are effused from the microcapsules of the photosensitive sheet and chemically reacted with the developing agents coated on the separate developing agents layer. Being reacted with the developing agents layer, the coloring reaction occurs on the developing agents layer surface, causing the photocopied image with colors corresponding to the original.

In either one of the exposing systems, self-contained type or transfer-type with separate developing agents layer, an electronic photoprinting system in which light is applied to the photosensitive sheet is employed, thus enabling a high quality photocopying image.

However, it is impossible to photocopy with such high quality on a sheet as mail card or plain paper and therefore the applied use of this photocopying to any other sheets of paper or card stock is strictly limited.

Actually, it is rather difficult to photocopy such sheets of paper as mail card or card stock. So these kinds of paper are adhered with another sheet which are photocopied and chemically reacted for coloring inside the sheet carrying microcapsules or with the separate developing agents layer.

Though the photocopying on the specific sheets of paper such as mail cards or plain paper can be replaced by adhering another photocopied sheet in this manner, there is a drawback that the sheets are double folded with specific sheet of paper and the photocopied paper in one sheet of paper, resulting in large in thickness and deteriorated finish of photocopied card.

The prior art related to the present invention is disclosed in patent applications filed by the same applicant which include Japanese Patent Applications No. 62-107026 filed on Apr. 30, 1987, 61-304993 filed on Dec. 19, 1987, 62-142557 filed on June 8, 1987, 62-45690 filed on Feb. 27, 1987, 62-196669 filed on Aug. 6, 1987, 62-45687 filed on Feb. 27, 1987, 62-150901 filed on June 17, 1987, 62-70505 filed on Mar. 26, 1987, 62-101026 filed on Apr. 30, 1987, 62-142557 filed on June 8, 1987, 62-193381 filed on July 31, 1987, 62-196670 filed on Aug. 6, 1987, 62-212328 filed on Aug. 26, 1987, and 62-228846 filed on Sept. 11, 1987.

SUMMARY OF INVENTION

It is therefore an object of the present invention to provide an image recording/adhering apparatus in which high quality photocopying finish can be achieved, for sheets of paper, such as mail card or plain paper on the same level with that of photocopying on a photosensitive sheet.

It is another object of the present invention to provide an image recording/adhering apparatus wherein developing agents are coated on a separate sheet by adhesive coating device for chemically reacting with a photo-pressure sensitive sheet to produce the photocopied color image.

It is still further object of the present invention to provide an image recording/adhering apparatus which allows easy photocopying of an original on an arbitrary medium without increasing thickness of the arbitrary medium.

These objects are attained by providing an image recording and adhering apparatus including an exposing means for image-wise exposing a pressure-sensitive photosensitive medium according to source image information so as to form thereon latent images and a developing means for applying a pressure to the image-wise exposed photosensitive medium so as to cause a chemical reaction with a developer material to thereby develop the latent images into visible images on a recording medium wherein the improvement comprises an adhering means for adhering a sheet of other medium on the reverse surface of the recording medium.

DETAILED DESCRIPTION OF THE INVENTION

Figure 1:
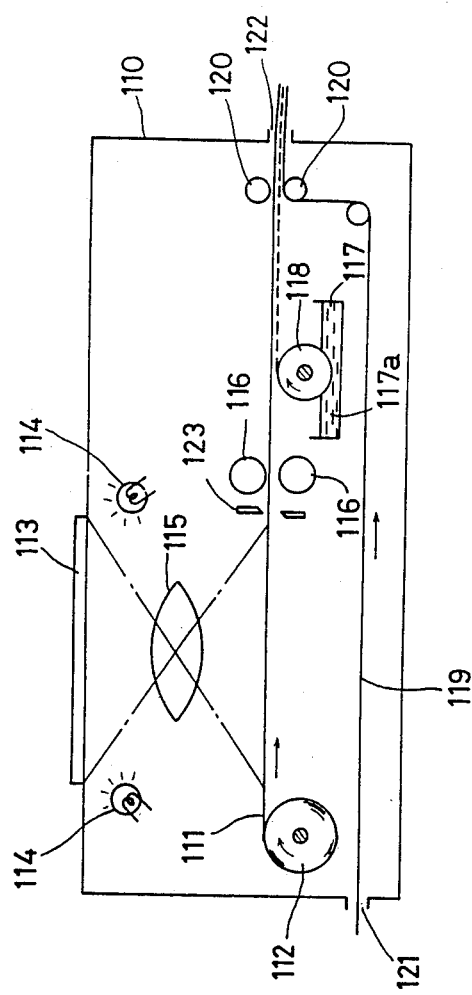
FIG. 1 is a total schematic illustration showing an image recording and adhering apparatus according to the present invention in which a self-contained photosensitive sheet is used.

In FIG. 1, a self-contained photo-pressure sensitive sheet (hereafter called photosensitive sheet) is disclosed to photocopy an original image according to the image recording and adhering apparatus of the present invention.

In the apparatus body 110 as shown, there is provided a sheet-supply roller 112 for rolling a rolled-up type photosensitive sheet 111. The photosensitive sheet 111 is released from a sheet-supply roller 112 and transported in a direction shown by an arrow in FIG. 1.

At the halfway travel of sheet 111, there is a means for exposing the surface of the photosensitive sheet 111 consisting of an exposing light 114 for photo-scanning a surface of an original 113 and optical lens 115 for focusing the scanned light onto the surface of the photosensitive sheet 111 and further a pressure developing means consisting of a pair of press rollers 116 for developing under pressure the exposed photo sensitive sheet 111.

There are at the after side of the rollers 116 (referring to the movement of sheet 111), an adhesive reservoir 117 housing adhesive 117a therein and an adhesive coater 118 for coating adhesive 117a on the reverse (bottom) surface of the photosensitive sheet 111 after being exposed. At the after side of the adhesive coater 118, there is further a pair of adhesion rollers 120 for adhering a sheet 119 of paper to be attached, such as mail cards, sheets of paper in general or plastic film, to the reverse surface of the sheet 111 with adhesive 117a. The sheet 119 to be attached to the photosensitive sheet 111 is transported from another line to the reverse surface of photosensitive sheet 111.

There is also a cutter 123 as shown on the transfer line to cut the photosensitive sheet 111 to a predetermined size. In an image recording and adhering apparatus thus constructed, the photosensitive sheet 111 is transported at a constant speed in the same direction shown in FIG. 1, the photosensitive sheet 111 is exposed to light 114 which scans the surface of the original 113.

The photosensitive sheet 111 is developed under pressure through press rollers 116 after it is cut off the paper roll to a predetermined size by cutter 123. Then, the adhesive is coated on the reverse side of the photosensitive sheet 111 by using the adhesive coater 118.

Consequently, the sheet 119 which is transported from an inlet port 121 into the apparatus 110 is overlapped with the adhesive coating surface of the photosensitive sheet 111. When both sheets are overlapped, they adhere tightly together by coated adhesive 117a under pressure through the adhesion rollers 120. The sheet 119 attached to the photosensitive sheet 111 is then chuted out of a chute-out port 122. Thus, there appears an image corresponding to the original 113 on the surface of the sheet 119.

Figure 2:
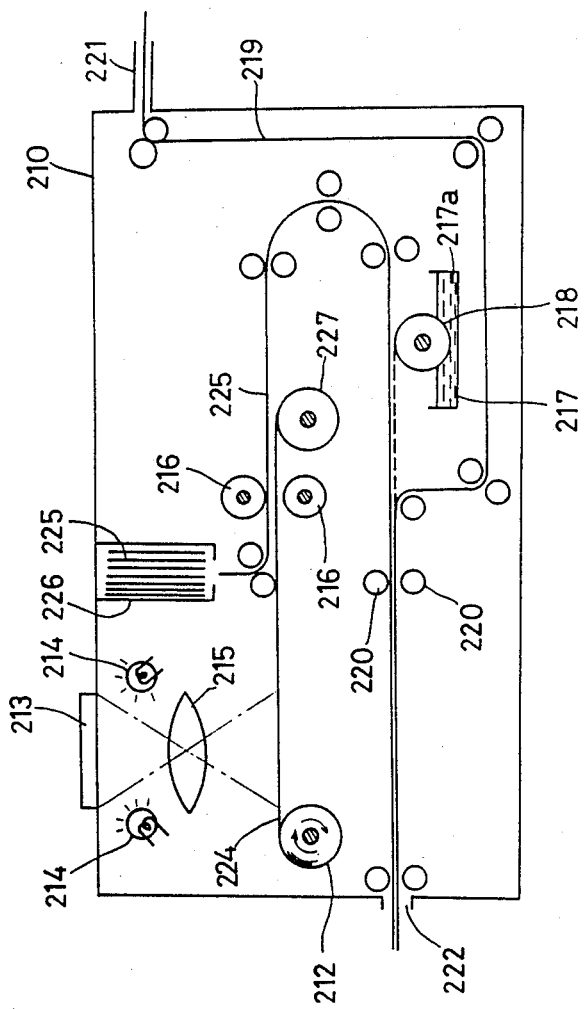
FIG. 2 is a total schematic illustration showing an image recording and adhering apparatus according to the present invention in which a transfer-type photosensitive sheet is used.

On the other hand, there is shown an image recording and adhering apparatus as shown in FIG. 2 according to the second preferred embodiment of the present invention. The photosensitive sheet of this apparatus is not provided with developing agents as previously described in connection with the prior art, a transfer sheet 225 (image-formed medium) is prepared separately in a housing cassette 226. In this embodiment, the original 213 is exposed to light 214 through a lens 215 to a photosensitive sheet 224.

The photosensitive sheet 224 is rolled out from a roll-out roller 212 and then transported into the press rollers 216 wherein the transfer sheet 225 is also transported and overlapped with the photosensitive sheet 224. Then, these two overlapped sheets, the photosensitive sheet and the transfer sheet, are developed herein under pressure by the press rollers 216. After pressed, there appears an image corresponding to an original on the transfer sheet 225. The transfer sheet 225 is further transported around and down to the adhesive coater 218.

Here, the adhesive 217a is housed in an adhesive reservoir 217 and coated as required on the reverse surface of the transfer sheet 225 so that it is stuck to a sheet separately transported from a paper inlet port 221. When the adhesive 217a is coated, the transfer sheet 225 is attached with the separately transported sheet 219 and transported further to an adhesion roller 220. The photosensitive sheet 224 is wound onto a winding roller 227 after passing through press rollers 216. Being under pressure herein, these sheets are closely seated with each other with adhesive and chuted out of the paper chute-out port 222.

The best modes to embody the present invention have so far been explained in details. However, the apparatus embodied herein is not restricted to these preferred embodiments but applied to other apparatuses imaginable, such as a laser printer, within a scope without deviating from the spirit of the present invention.

Figure 3:
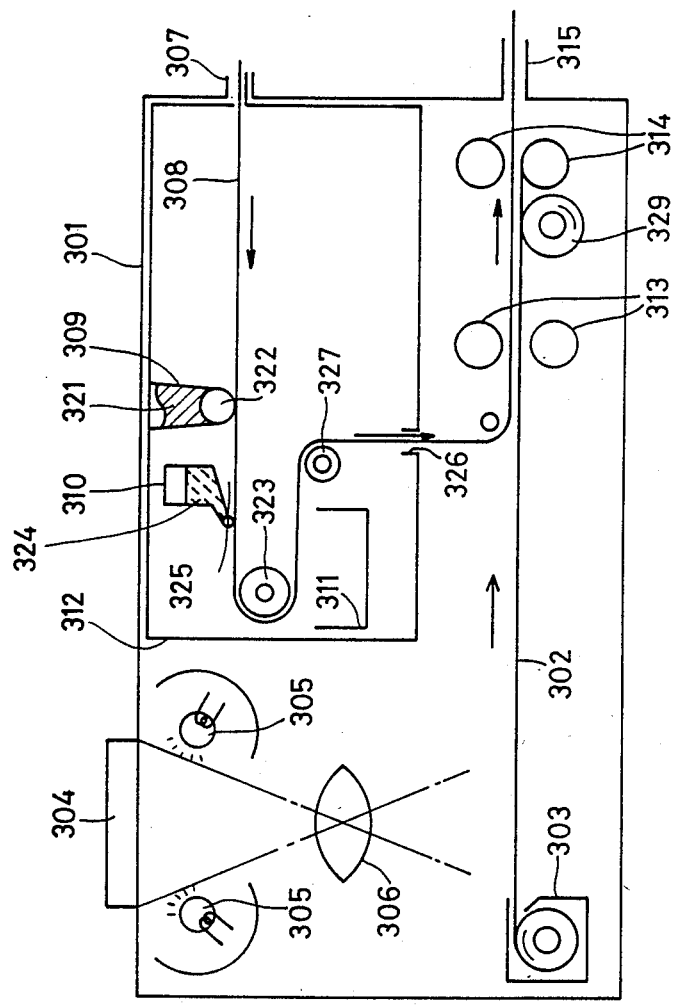
FIG. 3 is a total schematic illustration showing an image recording apparatus equipped with coating means for coating developing agents.
Figure 4:
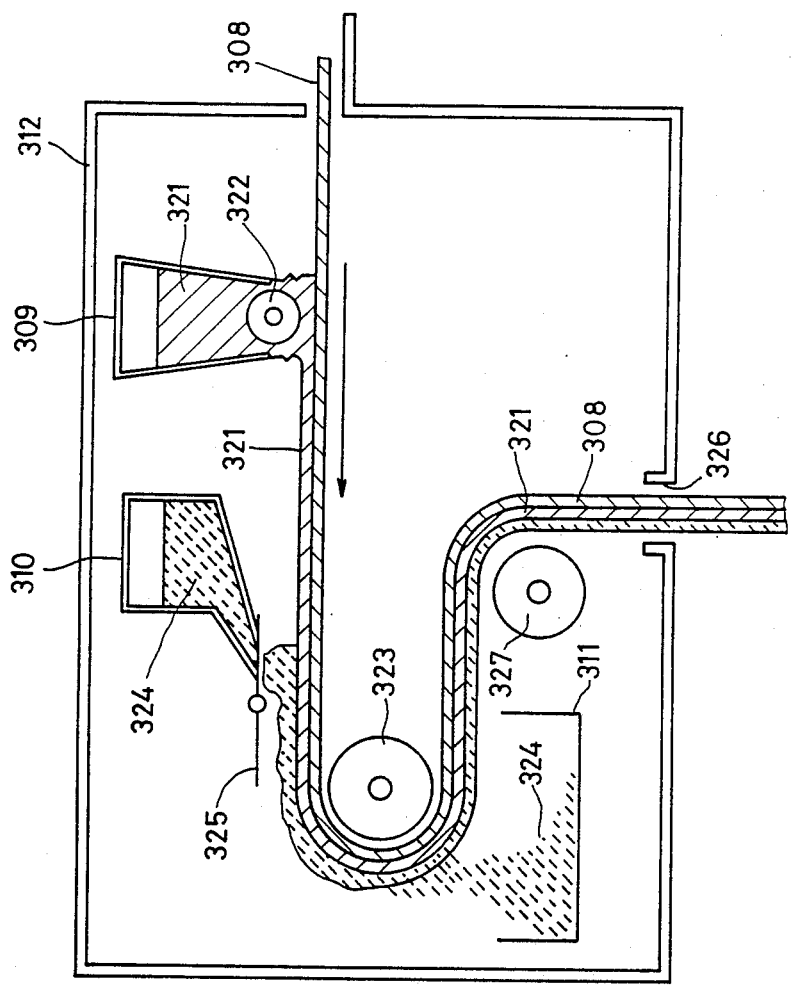
FIG. 4 is an enlarged schematic illustration showing the detail of the image recording apparatus of the preferred embodiment of the present invention.

Next, the third preferred embodiment of the present invention is explained. Referring to FIG. 3 and FIG. 4, the photosensitive recording medium 302 is rolled up over a paper supply roller 303 in a body 301 of image recording apparatus of the present invention. On one side of this photosensitive recording medium 302 is carried a plurality of microcapsules which encapsulate chromogenic materials and photopolymerization initiators. The photosensitive recording medium 302 is rolled out from the paper supply roller 303 and fed in the direction shown in FIG. 3.

At the halfway through transfer route of the photosensitive recording medium 302, there is a set of exposing means for exposing the surface of an original 304 and at the same time exposing the photosensitive recording medium 302, which includes a light source 305 and an optical lens 306 to focus a reflected light from the original 304 to the photosensitive recording medium 302.

Moreover, there is provided a paper insertion port 307 at one side of the body 301 of the image recording apparatus through which any arbitrary medium 308, for example a transfer sheet made of card, cloth or plastic film, to form image thereon can be inserted. The arbitrary medium 308 inserted from this insertion port 307 is inserted into a cassette 312 for coating developing agents. The details of this cassette for coating developing agents are enlarged in FIG. 4. This cassette 312 for coating developing agents is equipped with directional rollers 323, 327 and a feed roller (not shown) and constructed so as to introduce the inserted medium 308 to an exit port 326.

Further, there is provided a cartridge 309 for coating adhesives 321 and a cartridge 310 for coating developing agents 324 in the transferring direction of the arbitrary medium 308, respectively over the transferring route of the arbitrary medium 308 which is laid over between the paper insertion port 307 and the directional roller 323. This cartridge 309 for coating adhesives is so constructed as to coat adhesive 321 onto the arbitrary medium 308.

The adhesive agents herein applicable includes a water soluble adhesives such as dextrin, starch, polyvinyl alcohol, methylcellulose, water soluble phenol resin, casein, polystyrene maleate copolymer and solvent adhesives such as phenol resin, polyvinyl alcohol, polyvinyl chloride acetate copolymer, nitrocellulose, acetic cellulose, or other emulsion and non-soluble adhesives. The adhesive coating roller 322 for coating the adhesives 321 is made of rubber, sponge and resin.

The cartridge 310 for coating developing agents 324 is constructed so as to coat developing agents 324 on the adhesive coating surface of the arbitrary medium 308. This developing agent 324 is formed of inorganic substance such as acid earth, active clay, kaoline, phenol-family compound such as P-phenyl phenol, aromatic carboxylic acid compound such as salicylic acid, gallic acid. These compounds are used independently or combinedly used when chemically reacting as a developing agent.

The cartridge 310 for coating developing agents 324 is provided with a coating valve 325 for adjusting the coating quantity by opening or closing thereof. Under the lower part of the directional roller 323 is equipped a recollecting case 311 for recollecting the developing agents 324 after use. Using this recollecting case 311, the residual developing agents 324 are recollected in this recollecting case 311 when the arbitrary medium 308 changes its transferring direction. On the lower portion of the exit port 326 is arranged a pair of press rollers 313 mounted in mating rotation with each other.

When the arbitrary medium 308 is transferred down from the exit port 326 between these press rollers 313, the photosensitive recording sheet 302 is snugly seated with the arbitrary medium 308, thus pressing the microcapsules carried on the photosensitive recording medium 302 to the developing agents 224 on the arbitrary medium 308. Further, on the right side of the press roller 313 is a roll-up roller 329 for rolling up the photosensitive sheet 302 which is pressed with the press rollers 313. Still further on the right side thereof is arranged a pair of thermally fixing rollers 314 which are rotatably mounted in synchrony with each other for thermally fixing the arbitrary medium 308.

In operation, first, the light is emitted from a light source 305 and reflected on the original 304. This light 305 is focused on the photosensitive recording medium 302 through a lens 306, thus exposing the photosensitive recording sheet 302. While the photosensitive recording sheet 302 is thus being exposed, the arbitrary sheet 308 is on the other hand transferred from a medium insertion port 307 of the apparatus body 301.

Then, the adhesives 321 housed inside the cartridge 309 for housing adhesives 321 is coated on the arbitrary medium 308 by using an adhesive coating roller 322. After adhesive coating, developing agents 324 are poured over the arbitrary medium 308 from the cartridge 310 for coating developing agents.

The developing agents 324 are smoothly supplied over the arbitrary medium 308 by closing and opening a coating valve 325 as required. Then, the arbitrary medium 308 coated with developing agents 324 changes its transferring direction at a directional roller 323, thus throwing away residual developing agents 324 and depositing in a recollecting case 311 for housing developing agents 324. In this manner, the developing agents 324 are carried uniformly on the arbitrary medium 308 and discharged from an exit port 326.

The arbitrary medium 308 is further transferred and overlapped with the photosensitive recording medium 302. These overlapped sheets are then pressed for fixing with press rollers 313 and thermally fixed with each other through thermally fixing rollers 314. Finally, the arbitrary medium 308 thus thermally fixed for forming an original image is discharged out of a medium take-out port 315.

In this preferred embodiment of the present invention, the cartridge system is employed for coating adhesives and pouring developing agents on the arbitrary medium, thereby facilitating after-sales maintenance. By coating developing agents for coloring reaction on the separately prepared photosensitive recording sheet prior to exposure to light, the apparatus according to the present invention can photocopy any type of sheets without increasing the thickness of sheet to be photocopied because developing agents are coated on the sheet to be photocopied in advance.

However, the present invention is not necessarily restricted to this preferred embodiment only but applied to any other best modes of embodiments without deviating from the scope and spirit of the present invention.

What is claimed is:

1. An image recording and adhering apparatus including:
   an exposing means for image-wise exposing a pressure-sensitive photosensitive medium according to source image information so as to form thereon latent images and a developing means for applying a pressure to the image-wise exposed photosensitive medium so as to cause a chemical reaction with a developer material to thereby develop said latent images into visible images on a recording medium, wherein the improvement comprises:
   an adhering means for adhering a sheet of other medium on the reverse surface of said recording medium.

2. An image recording and adhering apparatus as claimed in claim 1, wherein said exposing means includes a light source illuminating said original and an optical member which permeates a reflected light beam from said original and illuminate said recording medium.

3. An image recording and adhering apparatus as claimed in claim 1, wherein said photosensitive medium being a self-contained type photosensitive sheet and comprising a sheet body, a developer material coated on one surface of said sheet body and capsules coated on said same surface of said sheet body, said capsules including therein photo-curable material and chromogenic material, said recording medium corresponding to said self-contained type photosensitive sheet.

4. An image recording and adhering apparatus as claimed in claim 1, wherein said photosensitive medium being a transfer type photosensitive sheet, comprising a photosensitive sheet and a transfer sheet overlapped on said photosensitive sheet, said photosensitive sheet comprising a sheet body and capsules coated on one surface of said sheet body, said capsules including therein photo-curable material and chromogenic material, one surface of said transfer sheet being coated with a developer material, said developer material being opposed to said capsules of said photosensitive sheet, said recording medium corresponding to said transfer sheet.

5. An image recording and adhering apparatus as claimed in claim 1, wherein said adhering means comprises adhesive, an adhesive reservoir and an adhesive coater to which said adhesive is supplied from said adhesive reservoir.

6. An image recording and adhering apparatus as claimed in claim 5, wherein said adhesive coater of said adhering means contacts to the reverse surface of said self-contained type photosensitive sheet.

7. An image recording and adhering apparatus as claimed in claim 5, wherein said adhesive coater of said adhering means contacts to the reverse surface of said transfer type photosensitive sheet.

8. An image recording and adhering apparatus including an exposing means for image-wise exposing a pressure-sensitive photosensitive medium according to source image information so as to form thereon latent images and a developing means for applying a pressure to the image-wise exposed photosensitive medium so as to cause a chemical reaction with a developer material to thereby develop said latent images into visible images on a recording medium, wherein the improvement comprises:
   a coating device for applying said developer material to said recording medium; and
   an adhering means for adhering a sheet of other medium on the reverse surface of said recording medium.

9. An image recording and adhering apparatus as claimed in claim 8, wherein said adhering means comprises an adhesive cartridge housing therein adhesive and an adhesive coater.

10. An image recording and adhering apparatus as claimed in claim 8, wherein said other medium is card, cloth and plastic film.

11. An image recording and adhering apparatus as claimed in claim 8, wherein said image recording and adhering apparatus further comprises a cartridge for coating said developer material on said adhesive on said other medium and a recollecting case of said developer material.

12. An image recording and adhering apparatus as claimed in claim 11, wherein said image recording and adhering apparatus further comprises a thermally fixing roller for thermally fixing formed image.

* * * * *